Oct. 12, 1965 B. O. VAN NESS 3,211,963

SEMICONDUCTOR SWITCHING CIRCUIT

Filed Dec. 28, 1961 2 Sheets-Sheet 1

INVENTOR.
Bradford O. Van Ness
BY
Mueller & Aichele
Attys.

Oct. 12, 1965 B. O. VAN NESS 3,211,963

SEMICONDUCTOR SWITCHING CIRCUIT

Filed Dec. 28, 1961 2 Sheets-Sheet 2

*INVENTOR.*

Bradford O. VanNess

*BY* Mueller & Aichele

Attys.

United States Patent Office
3,211,963
Patented Oct. 12, 1965

3,211,963
SEMICONDUCTOR SWITCHING CIRCUIT
Bradford O. Van Ness, Phoenix, Ariz., assignor to Motorola, Inc., Chicago, Ill., a corporation of Illinois
Filed Dec. 28, 1961, Ser. No. 162,717
14 Claims. (Cl. 317—148.5)

The present invention relates to a semiconductor switching circuit and particularly to a circuit capable of rapid switching of highly inductive loads with a minimum of power loss due to switching transients.

There are many present day applications where a transistor is called upon to perform a switching function for highly inductive loads. These applications include instances where it is desirable to control, switch or reverse unidirectional currents in coils setting up magnetic fields. These mentioned applications are particularly useful in the high frequency and microwave arts, where recent developments have shown that magnetic fields applied to certain iron oxide materials known as ferrites may be utilized in controlling electromagnetic propagation. This phenomena is based on the Faraday rotation effect and has been significant in the development of isolators, circulators and modulators for use with wave guides, strip line and coaxial lines at microwave frequencies. In addition, present day developments in the computer arts have made increasing use of the hysteresis properties of certain type of ferromagnetic cores to perform logic functions. Windings on such cores are energized to establish a magnetic field of a given direction. Reversal of the energizing current, and hence the magnetic field produced by these windings, creates a hysteresis effect for carrying out the computing operations.

It is often desirable in such applications to switch or to reverse the polarity of the unidirectional currents producing such magnetic fields in switching times in the order of microseconds. Because of the highly inductive nature of these currents, switching transients are characteristically present. Relatively slow switching times result because transients encountered in microsecond switching of inductive circuits become coupled with associated magnetic and metallic structures and are dissipated as eddy currents. This represents a net loss of energy to the system, which must be supplied from an external source, and causes a long exponential decay of the switched waveform. Conventional semiconductor switching circuits result in switching losses and switching times that make them unsuited for such applications.

It is therefore an object of the present invention to provide a magnetic field reversing semiconductor switching circuit capable of very rapid switching of the unidirectional current producing such a field.

It is another object of the invention to provide a semiconductor driver circuit wherein conservation of energy stored in the magnetic field is utilized during the switching period to substantially reduce switching transients.

It is still another object of the present invention to provide a semiconductor driver circuit wherein the switching transistors function as their own current regulators to provide a constant steady-state field in either direction over a wide range of operating conditions.

Yet another object of the invention is the provision of a semiconductor driver circuit having a minimum transient power demand so that inexpensive, readily available transistors may be utilized.

A still further object of the invention is the provision of a semiconductor driver circuit with improved circuit means for providing the control signal to the drive transistors of such a circuit.

A feature of the present invention is the provision of switching transistors for connection to each end of a center-tapped magnetic field producing coil to alternately provide direct current to each half of the coil to produce a reversible magnetic field. An energy storage inductor connected between a current source and the center tap of said field producing coil extracts energy from one coil winding and supplies it to the other during the switching periods to substantially reduce switching time and switching energy losses.

Another feature of the present invention is the provision of a two winding magnetic field producing coil with switching transistors connected to the ends thereof to produce alternate unidirectional magnetic fields when the quiescent conductive states of the switching transistors are reversed. An energy storage inductor is connected between a common point of the two windings and a source of unidirectional current and zener diode is connected between the common point of the coil windings and a reference potential so that the induced voltage developed across the storage inductor during switching of the transistors does not result in self-destruction of these transistors.

Another feature of the present invention is the provision of switching transistors, adapted to alternately supply unidirectional current to windings of a magnetic field producing coil, for operation as class "A" amplifiers. When in a steady-state conductive condition the switching transistor operates in the grounded base configuration to function as its own current regulator.

Still another feature of the invention is the provision of means, with the circuit of the above feature, to supply a closed loop regulating signal to a switching transistor in its steady-state conductive condition to cause it to function as a current regulator thereby supplying constant current to the coil winding.

A further feature of the present invention is the provision of a sensing resistor in series with switching transistors of a circuit adapted to alternately switch unidirectional current supplying an inductive load. The voltage developed across the resistor is proportional to the steady-state current through the conducting transistor and is utilized to control the transistor so that constant current may be supplied to the load in periods between switching operations.

Figure 1:
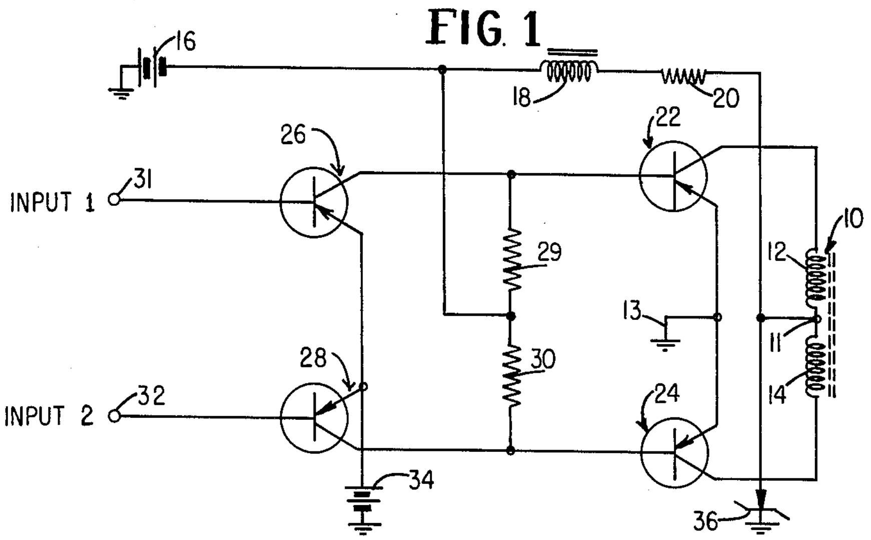
FIG. 1 is a basic semiconductor magnetic field reversing driver circuit capable of rapid switching operations.

The invention provides a magnetic field reversing semiconductor driver circuit having power driver transistors connected between ends of a field producing coil arrangement and a reference potential to complete a unidirectional current path through the coil arrangement. Conveniently the coil arrangement includes a center-tapped coil winding, or two coil windings each having one end commonly connected to receive a unidirectional current from a suitable source. An energizing current source connected to the common point or the center tap provides current flow through the current paths of the coil to establish an associated magnetic field. A control voltage supplied to the base electrode of each transistor operates to switch the transistors between conducting and nonconducting states. When either transistor is in its conducting state, the coil portion associated therewith produces a unidirectional magnetic field, and this field is in an opposite sense to the field associated with the other coil portion when the opposite transistor is in its conducting state. An energy storage inductor is provided in series between the current source and the energization point of the magnetization coil arrangement. This inductor is provided to have an inductive reactance sufficiently high with respect to the fundamental component of the switching transients so that it appears as a high impedance element during the switching time of the transistors, thus permitting a rapid change of the existing magnetic field. An induced voltage appears across this inductor during this period resulting in an incremental reverse current flow causing energy to be stored in the inductor. This stored energy is equivalent to the energy that had been previously stored in the magnetizing coil. Once the field in the magnetization coil has collapsed to zero and begins to build up in the opposite sense in other coil portions, the reverse current to the storage inductor ceases and the energy stored therein is extracted as a reverse field to the magnetizing coil. The high induced voltage across the storage inductor as limited by the zener diode forces the current in the coil to change more rapidly than natural time constants without energy storage would ordinarily permit, thus tending to produce a constant change in current with respect to time throughout energization of the coil portion creating a field in the opposite sense to that created by the previously energized coil rather than an exponential rate of change. Accordingly, it is possible to produce extremely rapid switching of the high inductive currents associated with the magnetization coil by use of such a storage inductor. There is a conservation of energy in the system since the energy stored in the field produced by the energized coil is extracted during its demagnetization and supplied to the other coil during its magnetization. This energy conservation results in a reduction of transient switching losses and substantially enhances switching speeds.

In a further embodiment of the present invention a current sensing resistor is provided in series with the switching transistors. When a steady-state condition has been reached, this resistor produces a voltage in response to the unidirectional current producing the magnetic field. This voltage in turn is compared with a reference voltage to detect any change in the current producing the magnetic field, and the conduction of the switching transistors is controlled in response thereto to compensate for any change in this current. In this manner the transistors which perform the switching function are self-regulating when in their steady-state condition to provide a constant current to the coil windings and hence a constant magnetic field.

Referring now to the drawings and in particular to FIG. 1, the basic semiconductor driver circuit illustrated therein includes magnetizing coil 10, center-tapped at 11 to provide separate windings 12 and 14. A suitable energy source 16 provides direct current through storage inductor 18 and current limiting resistor 20 to center tap 11 of coil 10.

One end of each of windings 12 and 14 are connected respectively to the collector electrodes of switching transistors 22 and 24. These transistors are preferably of the junction power type capable of handling several amperes of current. The emitters of transistors 22 and 24 are returned to common ground or reference point 13. Zener diode 36, poled to be conductive to a negative voltage of a predetermined magnitude, is connected between tap point 11 and a reference potential.

Base drive stages including transistors 26 and 28 control the potentials applied to the base electrodes of switching transistors 22 and 24. The base electrodes of transistors 22 and 24 are also supplied with biasing current through limiting resistors 29 and 30 from supply source 16 to control their conductive states in a manner hereinafter described. Collector voltage is supplied to transistors 26 and 28 from this same circuit arrangement. The emitters of transistors 26 and 28 are returned to a suitable bias supply 34 to maintain either transistor 22 or 24 in a cutoff condition with either transistor 26 or 28 respectively, in a conducting mode. Input terminals 31 and 32 connected to the base electrodes of each of transistors 26 and 28 are adapted to receive a control signal operable to change the conductive state of each of these two transistors.

To understand the mode of operation of the circuit embodiment of FIG. 1, assume that a signal is applied to input terminal 31 to change transistor 26 to a state of saturation while at the same time a control signal is applied to input 32 to maintain transistor 28 at cutoff. For the PNP devices biased in the manner shown, a positive potential at their base electrodes larger than source 34 will establish cutoff, while a negative going potential will tend to drive them into saturation. With transistor 26 in saturation, a low impedance path is provided between bias supply 34 and the base electrode of switching transistor 22. The potential from supply 34 is sufficient to overcome the biasing current from supply 16 through resistance 29 and thus switch transistor 22 to cutoff. Concurrently, as transistor 28 is cut off sufficient base current is supplied from supply 16 through limiting resistor 30 to the base electrode of switching transistor 24 to maintain this transistor in saturation. The low emitter-to-collector path provided by transistor 24 in its saturated state completes an energizing circuit for winding 14 from potential supply 16, and winding 14 therefore sets up a unidirectional flux field. Reversal of the input signals to terminals 21 and 32 causes the quiescent states of transistors 26 and 28 to be reversed, concurrently causing transistors 22 and 24 to switch their states of conduction. A unidirectional flux field of opposite polarity to that set up by winding 14 is then set up by winding 12. Since the impedance of windings 12 and 14 is highly inductive, switching transients are set up when the conductive states of transistors 22 and 24 are reversed. Because of the isolation provided to these transients by energy storage inductor 18, a high voltage is induced at center tap 11 during the collapse of the magnetic field in either winding 12 or 14 which is limited by zener diode 36. This induced voltage produces an incremental reverse current flow through storage inductor 18. When the field in the energized portion of the magnetizing coil has collapsed to zero and starts to build up in the reverse direction in the unenergized portion of the magnetizing coil by virtue of the switching action of transistors 22 and 24, the reverse current to inductor 18 decreases back towards zero and subsequently the energy stored in this inductor is extracted to aid in the reversal of the field in the magnetizing coil. This stored energy represented by the voltage across the inductor, forces the current to be changed more rapidly than the natural time constants of the circuit would ordinarily permit during the build-up of the field in a reverse direction, thereby substantially increasing the switching time of the driver circuit.

To insure that the high induced voltage appearing at tap point 11 will not cause reverse breakdown of transistors 22 and 24, Zener diode 36 conducts at a predetermined voltage level, below the breakdown voltage level of the switching transistors, but above the level of supply 16, to establish a constant voltage at this point during the switching period.

Figure 2:
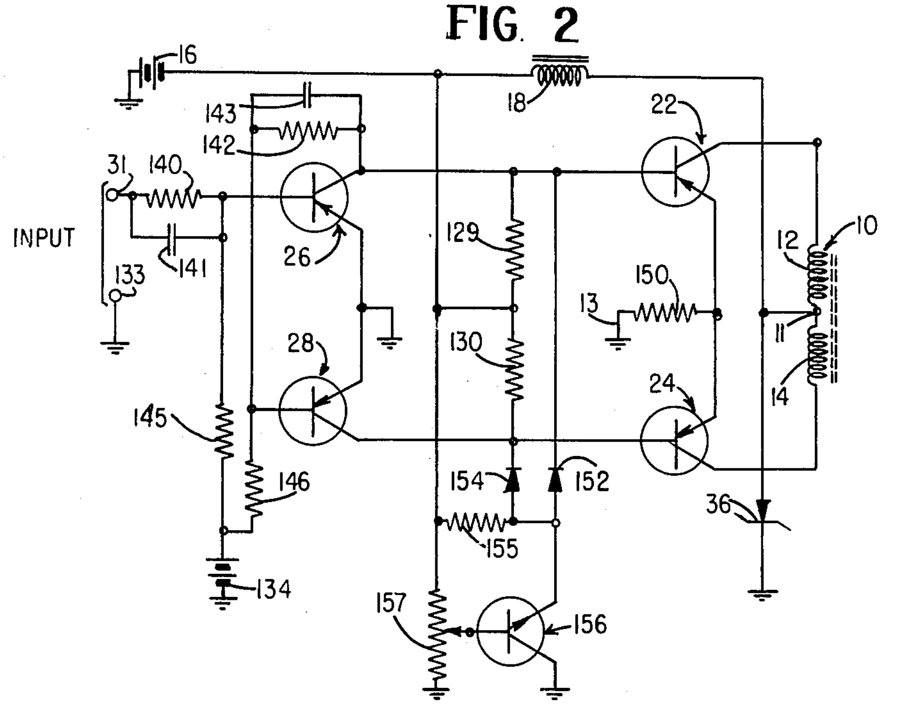
FIG. 2 is a modification of the circuit of FIG. 1 adapted for single ended input operation and having a provision for self-regulation of the current to the driver transistors.

FIG. 2 is a single ended input embodiment of the driver circuit of the present invention wherein a regulation circuit is provided to produce self-regulation in the switching transistors. In this circuit, like reference numerals refer to like circuit components as shown in FIG. 1.

As shown in FIG. 2, the often advantageous single-ended operation wherein one side of the input signal is maintained at ground potential is achieved by connecting the input of one of the base drive transistors to the output electrode of the other such transistor, thereby providing the necessary phase reversal to switch the magnetization coil driver transistors into alternate conductive states. An input control signal connected between terminal 31 and reference ground 133 is coupled to the base of transistor 26 through resistor 140 shunted by capacitor 141. The output collector electrode of this transistor, common to the base electrode of switching transistor 22, is coupled through resistor 142, shunted by capacitor 143, to the input base electrode of transistor 28. Transistors 26 and 28 are operated in a grounded emitter configuration and obtain suitable base bias potential through resistors 145 and 146 from supply 134. With zero potential input supplied to terminal 31 a positive voltage derived from battery 134 and appearing at the junction of resistors 140 and 145 biases transistor 26 off. A negative voltage derived from supply 16 appears at the collector electrode of transistor 26 when it is biased off and this negative voltage is in turn proportioned by resistors 142 and 146 to bias transistor 28 to conduction. When the input at terminal 31 is made sufficiently negative transistor 26 conducts and the voltage at its collector electrode approaches ground potential to allow the voltage at the junction of resistors 142 and 146 to be made positive by battery 134, thereby biasing transistor 28 off. Thus an input signal at terminal 31 having a swing between zero and a negative value will reverse the conductive states of transistors 26 and 28. By this arrangement a control signal at terminal 31 operable to alternately change the conductive state of transistor 26 concurrently produces an out-of-phase change in the conductive state of transistor 28. The output collector electrode of each of transistors 26 and 28 are connected to the input base electrodes of 22 and 24 respectively, to control the conduction of these two switching transistors in a manner hereinafter described.

The circuit of the embodiment of FIG. 2 also includes a current regulation control circuit to enable self-regulation of the current through switching transistors 22 and 24 when in a steady state condition between switching operations. To this end resistor 150 is connected between the emitters of transistors 22 and 24 and ground reference point 13. This resistor in addition provides a cutoff bias voltage necessary for operation of the switching transistor when controlled by grounded emitter base drive transistors 26 and 28. When transistor 26 is cutoff and a negative voltage appears at its collector electrode, transistor 22 conducts. At the same time the collector of transistor 28 is near ground potential and the voltage developed across resistor 150 by conduction of transistor 22 maintains transistor 24 cutoff. Reversal of the conductive states of transistors 26 and 28 by the input signal causes reversal of the conductive states of transistors 22 and 24. Diodes 152 and 154 connect the base electrodes of transistors 22 and 24, respectively, to potential supply 16 through resistor 155. The common point between these diodes and resistor 155 is further connected to the emitter electrode of control transistor 156. The collector electrode of transistor 156 is connected to a common reference point and a reference voltage is supplied to its base electrode from a suitable tap point on potentiometer 157.

With this circuit arrangement each of transistors 22 and 24, when in their conducting state, operate as a class A amplifier. Diodes 152 and 154 act as clamps so that when the potential at the base electrode of either transistor 22 or 24, in its conductive state, is sufficiently negative, the associated diode will conduct connecting the base electrode of the conducting switching transistor to the voltage established across resistor 157, coupled through transistor 156. Transistor 156 is an emitter follower stage to provide an impedance match so that the reference voltage developed across variable resistor 157 is presented from a low impedance source. Any change in voltage developed across resistor 150, proportional to the current between the collector and emitter of the conducting transistor of either of switching stage 22 or 24, becomes an error signal to its emitter to control its conduction. Because of the low impedance presented by the reference potential source connected to the base electrode of the switching stages, they effectively become grounded base series current segulators upon conduction of the clamping diodes completing a circuit path through the emitter follower to the common reference point. This causes the conducting driver transistor 22 or 24 to make use of the flat $I_c$ versus $E_c$ characteristic of such a grounded-base configuration for high gain junction transistors so that it is allowed to function as its own current regulator, resulting in constant direct current supplied to either winding 12 or 14 of magnetizing coil 10, thereby producing a steady unidirectional magnetic field of either polarity. At the same time, transistors 22 and 24 function as grounded emitter switching transistors operable to initiate switching action when control signals are supplied to their base electrodes through base drive transistors 26 and 28.

Base current for the conducting stage of transistors 22 and 24 is supplied through limiting resistors 129 and 130 from potential source 16. Sufficient current is further supplied through these two resistors to establish conduction in diodes 152 and 154 and to supply operating voltage for base drive stages 26 and 28. The value of current through windings 12 and 14 to establish a desired magnetic field strength is determined by the setting of potentiometer 157, also energized from source 16.

Figure 3:
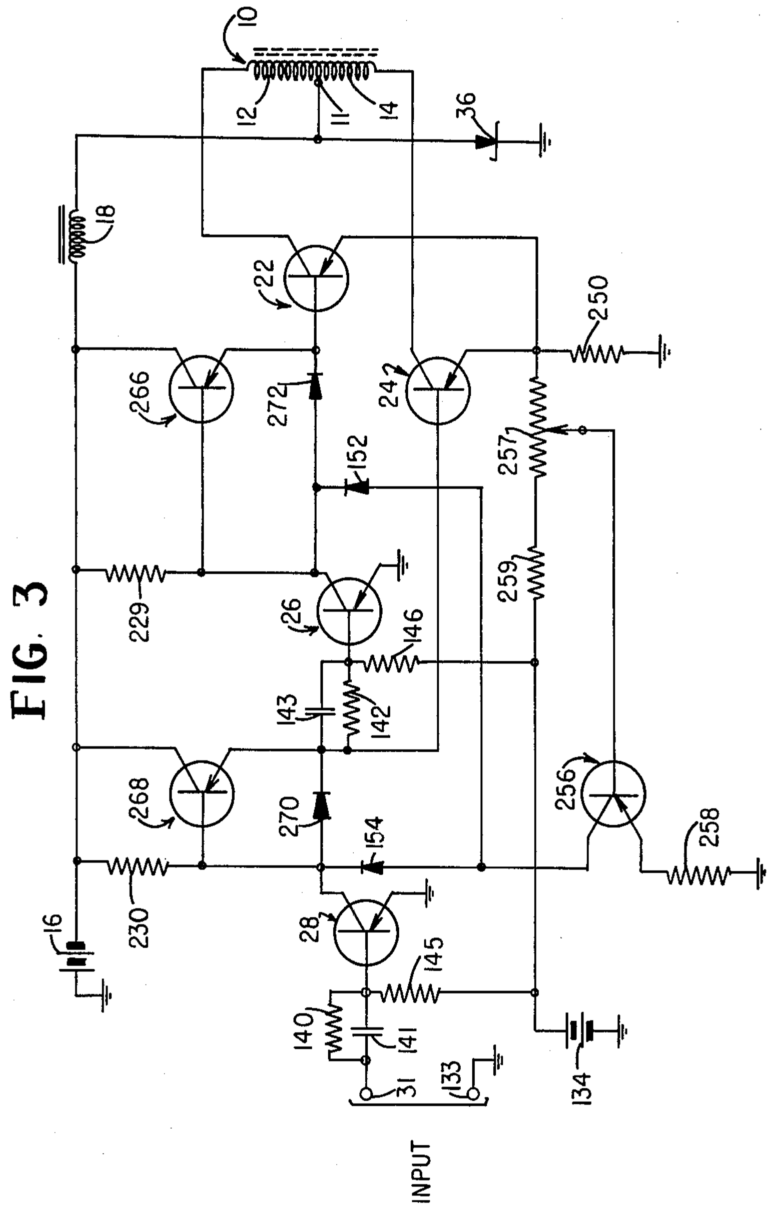
FIG. 3 is an improved version of the circuit of FIG. 2 wherein a closed loop current regulating circuit is provided.

FIG. 3 is another embodiment of the semiconductor driver circuit of the present invention. Emitter follower stages 266 and 268 are connected between the collector of each of transistors 26 and 28 and the base electrodes of transistors 22 and 24 respectively to provide additional base drive for the control of transistors 22 and 24. In the circuit shown, a zero potential input at terminal 31 causes transistor 24 to conduct, and a negative input at terminal 31 causes transistor 22 to conduct. The impedance transformation properities of the emitter follower circuit enables the relatively high collector impedance circuit of base drive transistors 26 and 28 to be coupled to the base electrodes of switching transistors 22 and 24 from a low impedance source. The high current gain, low impedance properties of the emitter follower stages therefore allows relatively low gain, high collector current transistors to be utilized for the switching transistors, while at the same time presenting a low impedance for fast, reliable switching operation. Since base drive transistors 26 and 28, when driven into conduction, tend to cutoff the emitter followers, high conductance diodes 270 and 272 are shunted across the base-emitter junction of emitter follower transistors 266 and 268. These diodes are poled to provide a low impedance path between the base electrode of the non-conducting switching transistor through the collector-emitter junction of the base drive transistor to a ground reference potential.

To provide for closer regulation of the current through switching transistors 22 and 24, a closed loop regulation circuit is employed in the circuit embodiment shown in FIG. 3. To this end resistor 250 is connected between the emitters of transistors 22 and 24 and a common reference point. Resistor 259 and potentiometer 257 are series connected between the common connection of these emitters and voltage supply 134. Transistor 256, functioning as a current control amplifier, has its base electrode connected to a tap point on potentiometer 257. Stabilizing resistor 258 connects the emitter electrode of transistor 256 to ground reference potential. The collector electrode of this transistor is connected to the junction point of diodes 152 and 154, which in turn are connected to the respective base electrodes of transistors 22 and 24 by emitters followers 266 and 268 to act as clamps in the same manner as in the circuit of FIG. 2.

When a control signal applied to terminal 31 switches transistor 28 to a non-conducting state the voltage at the base of transistor 268 rises to a negative value to produce collector-to-emitter current in this transistor. This in turn causes switching transistor 24 to conduct, energizing winding 14 of coil 10. The base-to-emitter voltage drop across transistor 268 is sufficient to prevent conduction of diode 270. Current returned through sensing resistor 250 is equal to the sum of the base and collector currents in switching transistor 24 and produces a voltage drop across this resistor sufficient to cause transistor 256 to conduct. The point at which control transistor 256 conducts is established by a setting of the tap on potentiometer 257. Conduction of control transistor 256 establishes a voltage which opposes the negative potential at the base of transistor 268, which in turn determines the amount of base drive supplied to transistor 24 and therefore its emitter current value. A decrease in current through coil winding 14 and hence a decrease in collector current to transistor 24 results in a decrease in voltage drop across sensing resistor 250. This in turn causes reduced conduction in transistor 256, causing transistor 268 to increase the base drive and thus the conduction of transistor 24. On the other hand, increased collector current through transistor 24 produces an increased voltage drop across sensing resistor 250 and in a like manner increased conduction of transistor 256 results in a reduction in the base drive to transistor 24. Thus, this circuit produces a closed loop regulating system which tends to cause constant collector current to flow through transistor 24 to set up a constant magnetic field in winding 14. When the control signal to input terminal 31 is such to cause conduction of transistor 28, an out-of-phase signal coupled to the base of transistor 26 causes non-conduction in this transistor, with resultant reversal of the conductive states of transistors 22 and 24. In like manner regulation of the current to transistor 22 is achieved to produce constant current through winding 12.

In a particularly successful circuit embodiment, the circuit of FIG. 3 was adapted to use commercially available PNP junction power transistors to provide four amperes of magnetization current. Switching was accomplished in less than 20 microseconds, while at the same time steady-state current differential between the two switching transistors was held to be within plus or minus 0.5%. Switching was accomplished by a 3 volt level change at the control input terminal, and a switching repetition rate from 0 to 3,000 c.p.s. was readily achieved. A 6 volt positive and a 6 volt negative supply is capable of supplying all necessary operating voltages. As is readily apparent from the drawings, PNP transistors are shown with collector voltages supplied from a negative source. Accordingly, conduction is initiated and controlled by a negative going potential applied to their respective bases. It should be obvious to those versed in the art, however, the NPN devices may also be utilized, with corresponding polarity reversal of supply and control voltages.

The following circuit parameters were used, and these parameters are listed herein merely by way of example and are not intended to limit the invention in any way.

| | | |
|---|---|---|
| Inductor **18** | millihenries | 3 |
| Transistors **22, 24** | | 2N1551 |
| Transistors **26, 28** | | 2N425 |
| Zener diode **36** | | 10M30ZR5 |
| Transistor **256** | | 2N650 |
| Transistors **266, 268** | | 2N671 |
| Diodes **152, 154, 270, 272** | | 1N283 |
| Resistor **250** | ohms | 0.5 |
| Potentiometer **257** | do | 100 |
| Resistor **258** | do | 27 |

The magnetization coil windings were adapted to supply 60 ampere-turns to a "C" core. The three millihenry energy storage inductors provide sufficient isolation and energy conservation for the 25 kilocycle fundamental transients associated with the above-mentioned 20 microsecond switching speeds. It should be readily apparent, however, that other circuit values and operating conditions may be utilized to provide the novel high-speed switching circuit of the present invention.

The invention provides therefore, a magnetic field reversing semiconductor driver circuit capable of extremely rapid switching of highly inductive circuits. An energy storage inductor forces a change in current during the switching period more rapidly than the natural time transients of the system. At the same time this inductor minimizes transient power demand and reduces overall steady state power dissipation in the circuit. The circuit is further readily adaptable to a very simple and effective means for providing constant energizing current for the magnetic fields thereby produced by utilizing the switching transistors as their own current regulators when in a conductive state between switching operations.

I claim:

1. A switching circuit adaptable for connection to an inductive load, said load having a common energization point and two branch current paths and being operable to receive current flow alternately through each of said two paths, said switching circuit including in combination, first and second transistors having emitter, collector and base electrodes, current sensing impedance means connecting said emitter electrodes to a reference potential, means to connect the collector electrode of each said transistor to the load to provide collector to emitter circuit paths for each branch current path of the load, inductor means adaptable to be connected between an energization current means and said common energization point, first circuit means connected to the base electrodes of said transistors to produce conduction in one of said transistors while producing non-conduction in the other of said transistors, and second circuit means coupled to the base electrodes of said transistors and coacting with a signal developed across said impedance means to provide self-regulation of the conducting one of said transistors during intervals of steady state conduction to thereby supply constant current to the load.

2. In a circuit for controlling unidirectional current flow alternately in each of two windings of a magnetic field producing coil, said coil having a common point adapted to be connected to means for supplying unidirectional current and end points adapted to be connected to a current controlling circuit, the combination including energy storage inductor means having a first terminal adapted to be connected to said common point and a second terminal adapted to be connected to the current supplying means, zener diode means connected between said first terminal and a reference potential, first and second transistors having collector, emitter, and base electrodes, means to connect the collector electrode of said first transistor to one end point of said coil, means to connect the collector electrode of said second transistor to the other end point of said coil, current sensing impedance means connecting the emitter electrodes of said transistors to a reference potential, first control means connected to the base electrodes of said transistors to switch their quiescent conductive states so that conduction of one transistor allows unidirectional current flow in one winding of said coil to produce a magnetic field of a given sense and conduction of the other transistor allows unidirectional current flow in the other winding of said coil to produce a magnetic field of the opposite sense, whereby during change of the conductive states of said transistors the decaying magnetic field of one sense causes energy to be stored in said inductor means to be subsequently released to aid build-up of a magnetic field of the opposite sense, and second control means coupled with said first control means and coacting with a signal developed across said current sensing impedance means to regulate collector-emitter current of the conducting one of said transistors to thereby supply constant current to the load during periods of steady state conduction.

3. The circuit of claim 2 wherein the voltage breakdown potential of said zener diode is higher than the voltage of the means supplying unidirectional current through said windings, and lower than the reverse breakdown voltage of said transistors.

4. The circuit of claim 3 wherein the inductance of said energy storage inductor means presents sufficiently high inductive reactance to the fundamental switching transients occurring when the conductive states of said transistors are changed to produce a high instantaneous voltage at said common point to cause a reverse incremental current flow through said inductor means, so that energy is stored in said inductor means during the decay of the magnetic field of one sense, and is extracted from said inductor during the build-up of the magnetic field of an opposite sense.

5. The circuit of claim 2 wherein said second control means includes a low impedance reference voltage source operably connected to the base electrode of the conducting one of said transistors, with the reference voltage coacting with a voltage developed across said current sensing impedance means to regulate current through the conducting one of said transistors.

6. A magnetic field producing apparatus including in combination, a magnetic field producing coil, said coil having a pair of windings, a common terminal for connection to one end of each of said windings, and end terminals for connection to the other end of each of said windings, means to supply unidirectional current to said common terminal, inductor means series connected between said supply means and said common terminal, first and second transistors having collector, emitter, and base electrodes, means to connect the collector electrode of said first transistor to one said end terminal, means to connect the collector electrode of said second transistor to the other said end terminal, current sensing impedance means connecting the emitter electrode of each said transistor to a reference potential, first control means connected to the base electrode of each said transistor to switch their quiescent conductive states so that conduction of one said transistor causes unidirectional current flow in one said winding to establish a magnetic field of a given polarization and conduction of the other said transistor causes current flow in the other said winding to establish a magnetic field of an opposite polarization, whereby energy is stored in said inductor means during the decay of the magnetic field of one polarization, and is extracted from said inductor means during the build-up of the magnetic field of the opposite polarization, and second control means connected to the base electrodes of said transistors and coacting with a signal developed across said current sensing impedance means so that said transistors function as current regulators to provide substantially constant current flow through said coil windings during periods of steady state conduction.

7. In a magnetic field producing apparatus of the type using a field producing coil having a common point adapted to be connected to means for supplying unidirectional current and two end points, the combination including inductor means having a first terminal for connection to the current supplying means and a second terminal for connection to said common point, voltage regulating diode means connected between said second terminal and a first reference potential, first semiconductor means having a first electrode adapted to be connected to one said end point and a second electrode connected to said first reference potential by a resistor, second semiconductor means having a first electrode adapted to be connected to the other said end point and a second electrode connected to said first reference potential by said resistor, and control means connected to a third electrode of each of said semiconductor means, said control means including semiconductor devices having an input electrode to receive an input signal and output electrodes to connect said third electrodes to a second reference potential in response to said input signal, with said second reference potential and a voltage developed across said resistor regulating current through the conducting one of said semiconductor means, whereby alternate application of said input signal to said input electrodes alternately causes switching of the conductive states of said first and second semiconductor means to provide constant current flow through said field producing coil between said common point and each of said end points.

8. In a circuit for controlling unidirectional current flow alternately in each of two windings of a magnetic field producing coil, said coil having a common point adapted to be connected to means for supplying unidirectional current and end points adapted to be connected to said current controlling circuit, the combination including inductor means having a first terminal adapted to be connected to said common point and a second terminal adapted to be connected to said current supply means, zener diode means connected between said first terminal and a reference potential, first and second transistors having collector, emitter and base electrodes, means to connect the collector electrode of the first transistor to one end point of said coil, means to connect the collector electrode of the second transistor to the other said end point of said coil, a resistor connecting the emitter electrodes of the first and second transistors to a reference potential, first control means connected to the base electrodes of said transistors, said first control means including third and fourth transistors having collector, emitter, and base electrodes, a signal input terminal, means connecting the signal input terminal to the base electrode of the third transistor, means connecting the collector electrode of the third transistor to the base electrode of the fourth transistor, means connecting the emitter elecrodes of the third and fourth transistors to said reference potential, means connecting the collector electrode of the third transistor to the base electrode of one of said first and second transistors, means connecting the collector electrode of the fourth transistor to the base electrode of the other of the first and second transistors, so that the third and fourh transistors are responsive to the magnitude of a signal applied to the input terminal to control the quiescent conductive states of the first and second transistors, whereby conduction of one of the first and second transistors allows unidirectional current flow in one said winding to produce a magnetic field of one sense and conduction of the other of said first and second transistors allows unidirectional current flow in the other winding to produce a magnetic field of the opposite sense, and second control circuit means coupled to the base electrodes of the first and second transistors and responsive to the voltage developed across said resistor to cause said first and second transistors to function as a current regulator during intervals of steady state conduction.

9. A current switching circuit for supplying constant current from an unregulated source during periods of steady-state conduction, said circuit including in combination, transistor means having collector, emitter, and base electrodes, output circuit means to connect said collector electrode to current supplying means, current sensing impedance means connected between said emitter electrode and a reference potential, circuit means coupling said base electrode to input terminal means and operable to control the quiescent conductive state of said transistor in response to a control signal applied to the input terminal means, said circuit means including low impedance reference voltage source, and diode means operable to connect said base electrode to said reference voltage source as said base electrode receives a control signal of a predetermined magnitude, so that a control signal supplied to said base electrode switches said transistor means between states of non-conduction and conduction, said control signal applied to said base electrode to render said transistor means in the state of conduction also rendering said diode means conducting so that said base electrode is effectively connected to a reference voltage through said low impedance reference voltage source and said sensing means applies a current responsive signal to said emitter electrode to cause constant collector current to flow from said current supplying means.

10. The circuit of claim 9 wherein said low impedance reference voltage source includes a transistor having an input electrode for connection to a voltage source and output electrodes connected to provide a low impedance current path between said diode means and said reference potential.

11. A switching circuit adaptable for connection to an inductive load, said load having a common energization point and two branch current paths and operable to receive current flow alternately through each of said two paths, said switching circuit including in combination, first and second transistors having emitter, collector and base electrodes, current sensing means connected between said emitter electrodes and a reference potential, means to connect the collector electrode of each said transistor to said load to provide collector to emitter circuit paths for each said branch current path of the load, inductor means adaptable to be connected between an energization current supply means and said load energization point, control circuit means connected to the base electrodes of said transistors to provide a signal operable to produce conduction in one of said transistors while producing non-conduction in the other said transistor, means supplying a low impedance reference voltage, and means operable to connect the base electrode of the conducting transistor to said reference voltage means as said signal exceeds a predetermined magnitude so that the base electrode of the conducting transistor is connected to said reference potential through said low impedance voltage supplying means, whereby said sensing means applies a current responsive signal to said emitter electrode to cause constant collector current to flow from said current supplying means.

12. A switching circuit adaptable for connection to an inductive load, said load having a common energization point and two branch current paths and operable to receive current flow alternately through each of said two paths, said switching circuit including in combination, first and second transistors having emitter, collector and base electrodes, current sensing means connected between said emitter electrodes and a reference potential, means to connect the collector electrode of each said transistor to said load to provide collector to emitter circuit paths for each said branch current path of the load, inductor means adaptable to be connected between an energization current means and said load energization point, control circuit means connected to the base electrodes of said transistors to provide a signal operable to produce conduction in one said transistor while producing non-conduction in the other said transistor, third transistor means having control electrode, output electrode, and common electrode, diode means connecting base electrode of first said transistor to said output electrode, diode means connecting base electrode of said second transistor to said output electrode, current limiting means connecting said common electrode to said reference potential, means to connect said control electrode to said emitter electrodes, and means supplying a reference voltage between said control electrode and said reference potential.

13. A current switching circuit for supplying constant current from an unregulated source to a load during intervals of steady state conduction, said circuit including in combination, a first transistor having collector, emitter and base electrodes, impedance means including the load connecting the collector electrode of said first transistor to the unregulated source, current sensing impedance means connected between the emitter electrode of said first transistor and a reference potential, an input terminal, control circuit means coupling the base electrode of said first transistor to said input terminal and operable to switch said first transistor between states of conduction and non-conduction in response to a signal applied to said input terminal, said control circuit means having a second transistor with first, second and third electrodes, means coupling the first and second electrodes of said second transistor in circuit between the base electrode of said first transistor and a reference voltage, means coupling the third electrode of said second transistor to said current sensing impedance means, said second transistor being responsive to the voltage developed across said current sensing impedance means and to the signal applied to said base electrode to control conduction between the first and second electrodes thereof and thereby regulate conduction of said first transistor, so that said first transistor supplies substantially constant current to the load during intervals of steady state conduction.

14. A current switching circuit for supplying constant current from an unregulated current supply during periods of steady state conduction, said circuit including in combination, transistor means having collector, emitter, and base electrodes, output circuit means for connecting said collector electrode to the unregulated current supply, current sensing resistor means connected between said emitter electrode and a reference potential, input circuit means coupled to said base electrode and operable to control the quiescent conductive state of said transistor in response to a control signal, with the control signal supplied to said base electrode switching said transistor means between states of non-conduction and conduction, means forming a low impedance reference voltage source, and high conductance diode means connecting said base electrode to said reference voltage source, said diode means being rendered conducting as said base electrode receives a control signal of a predetermined magnitude to effectively connect said base electrode to said low impedance reference voltage source, so that said current sensing resistor means applies a current responsive signal to said emitter electrode to cause substantially constant collector current to flow from the current supply through said output circuit means.

References Cited by the Examiner

UNITED STATES PATENTS

| | | | |
|---|---|---|---|
| 2,540,654 | 2/51 | Cohen et al. | |
| 2,898,526 | 8/59 | Trousdale | 317—148.5 X |
| 2,941,125 | 6/60 | Lippincott | 317—123 |
| 2,951,186 | 8/60 | Dickinson | 317—123 |
| 3,003,108 | 10/61 | Thiele | 317—148.5 X |
| 3,010,053 | 11/61 | Schubert | 317—148.5 |
| 3,050,636 | 8/62 | Sommerfield. | |
| 3,067,388 | 12/62 | Frank. | |
| 3,140,427 | 7/64 | Frieberg | 317—148.5 |

FOREIGN PATENTS

| | | |
|---|---|---|
| 836,060 | 6/60 | Great Britain. |
| 842,219 | 7/60 | Great Britain. |

SAMUEL BERNSTEIN, *Primary Examiner.*